United States Patent
Dietz et al.

(10) Patent No.: US 7,230,342 B2
(45) Date of Patent: Jun. 12, 2007

(54) REGISTRATION MARK WITHIN AN OVERLAP OF DOPANT REGIONS

(75) Inventors: Franz Dietz, Untereisesheim (DE);
Volker Dudek, Brackenheim (DE);
Michael Graf, Leutenbach (DE);
Stefan Schwantes, Heilbronn (DE);
Gayle W. Miller, Jr., Colorado Springs, CA (US)

(73) Assignee: Atmel Corporation, San Jose, CA (US)

( * ) Notice: Subject to any disclaimer, the term of this patent is extended or adjusted under 35 U.S.C. 154(b) by 28 days.

(21) Appl. No.: 11/217,250

(22) Filed: Aug. 31, 2005

(65) Prior Publication Data
US 2007/0048959 A1    Mar. 1, 2007

(51) Int. Cl.
*H01L 23/544* (2006.01)
(52) U.S. Cl. .............................. 257/797; 257/E23.178
(58) Field of Classification Search ................ 257/797, 257/E23.179
See application file for complete search history.

(56) References Cited

U.S. PATENT DOCUMENTS

| | | | |
|---|---|---|---|
| 5,851,864 A | 12/1998 | Ito et al. ..................... 438/203 |
| 5,856,695 A | 1/1999 | Ito et al. ..................... 257/370 |
| 5,952,694 A * | 9/1999 | Miyawaki et al. .......... 257/347 |
| 6,329,265 B1 * | 12/2001 | Miyawaki et al. .......... 438/401 |
| 2002/0030290 A1 * | 3/2002 | Hirase et al. ................ 257/797 |
| 2002/0146889 A1 * | 10/2002 | Coobaugh et al. .......... 438/401 |

* cited by examiner

*Primary Examiner*—Thao P. Le
(74) *Attorney, Agent, or Firm*—Schneck & Schneck; Thomas Schneck

(57) ABSTRACT

A first mark, in a double-well integrated circuit technology, is formed by a first etching of a first mask layer on top of an ONO stack. After a first well is doped, a second etching occurs at the first etching sites in the uppermost layer of oxide of the ONO stack forming a first alignment artifact. A second mask layer is applied after removing the first mask layer. A second well doping occurs at second mask layer etching sites to maintain clearance between the two wells within active areas and provide an overlap of the two wells in a frame area. At the first alignment artifact in the overlap of the two wells, further etchings remove remaining layers of the ONO stack and remove silicon from the upper most layer of the semiconductor forming a second registration mark, which may be covered by a protective layer.

5 Claims, 5 Drawing Sheets

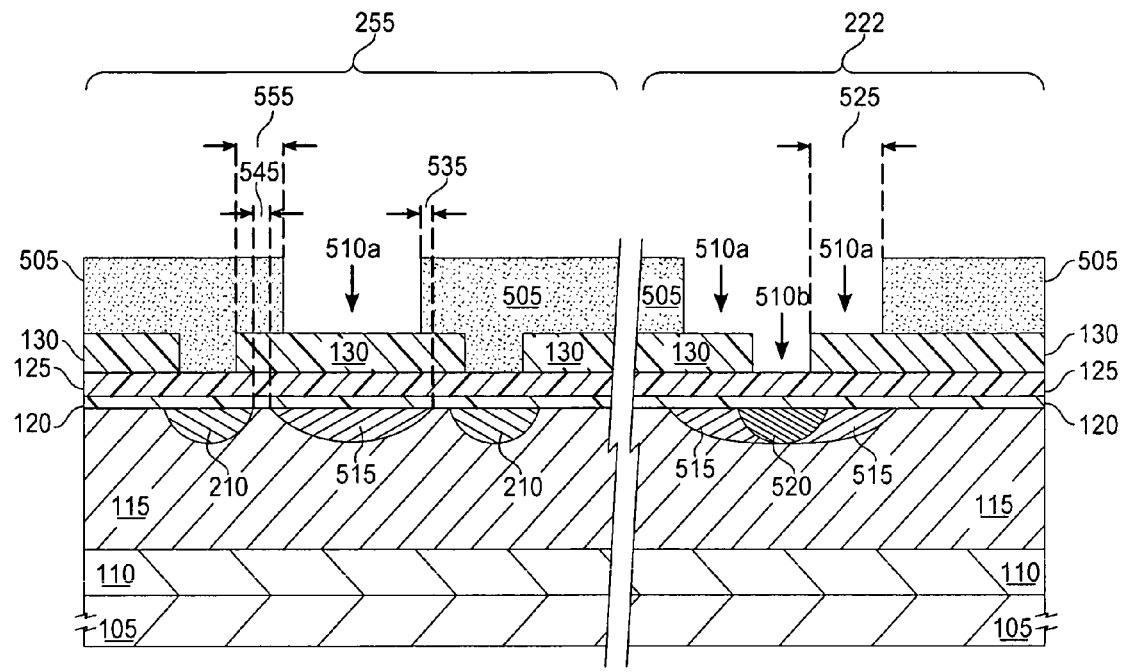
Fig._5
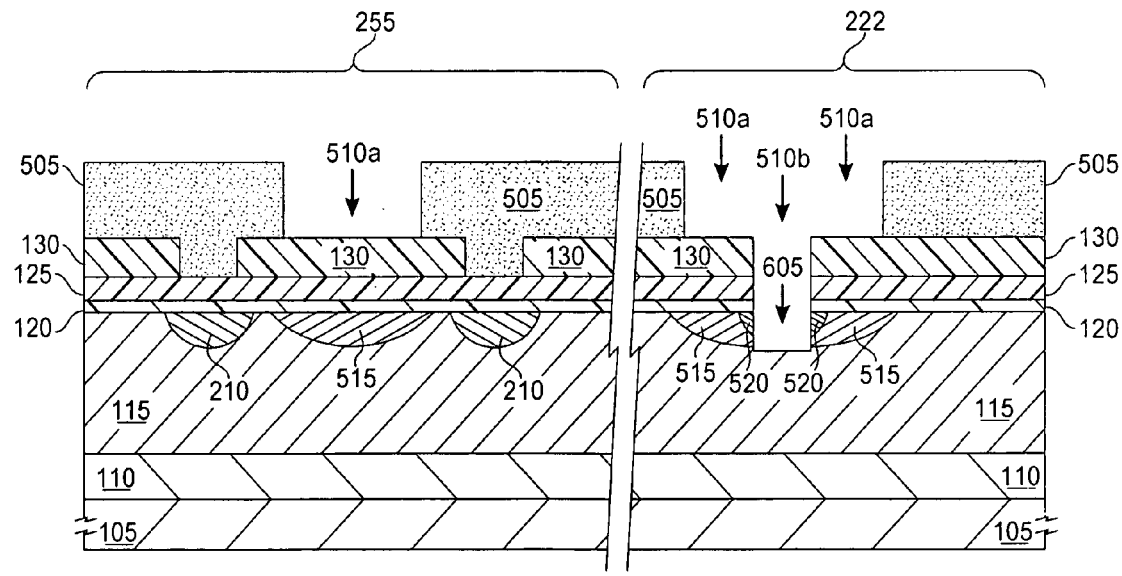
Fig._6

REGISTRATION MARK WITHIN AN OVERLAP OF DOPANT REGIONS

TECHNICAL FIELD

The present invention relates to the general fabrication of an integrated circuit. More specifically, the invention is a registration mark for mask alignment and a method of fabrication of the mark in a semi-conductor technology.

BACKGROUND ART

In integrated circuit production, a layer-to-layer alignment and registration of fabrication masks is critical. The alignment of one mask layer to another or of a mask layer to a previously applied dopant is frequently critical to the fabrication of active devices or to electrical properties such as isolation capabilities, threshold parameters, or breakdown voltages. A misalignment of a sequence of fabrication steps may mean that a device is out of specification or inoperable. Yield and performance numbers for a device in production may vary significantly causing considerable cost consequences.

Typically a device site on a semiconductor wafer will have alignment or registration marks in the kerf or scribe line area. These registration marks allow automated or manually adjusted optical equipment, such as mask alignment tools, to register a mask layer to the die site. Many interdependencies exist in mask alignment including a lack of "run-out" (nonlinearity) in the features across the mask surface as well as an accurate planarity of the mask relative to the die surface. Variation of these quantities must be kept to a minimum over a considerable distance in order for features in the middle of the die area to be rendered accurately.

Certain technologies require device dimensions to be critically positioned in order to meet specifications and perform as intended. Device performance parameters such as breakdown voltages, threshold voltages, and electrical isolation capabilities depend critically on fabrication layer-to-layer registration in certain integrated circuit technologies such as high-voltage MOS (HVMOS), DMOS and BCD-MOS (Bipolar CMOS-DMOS). These technologies rely crucially on fabrication alignment to have sufficient electrical performance characteristics and yield.

For example, in DMOS technology, a drain-to-source breakdown voltage (BVDSS) and an "on-channel resistance" ($R_{DS(ON)}$) vary directly with a variation in layer-to-layer registration. What is needed is a method and structure to allow mask alignment and registration of the critical layers to be accomplished within either a die site frame or a die site itself.

DISCLOSURE OF INVENTION

A double-well integrated circuit technology is fabricated with an overlap of two dopant regions. Within the overlap region, a registration mark is fabricated by further etching through protection layers and an upper layer of a semiconductor substrate at a first dopant window. Following etching, a passivation layer is applied. The first dopant window is an artifact of a doping step of the first well and a first etching of an uppermost protection layer. The overlap region is formed from two dopants. Improved alignment capabilities provide commensurate enhancement of critical device electrical operating parameters that depend on topological registration. No extra masks are required to fabricate the registration mark and no additional topological buildup occurs as with registration marks fabricated with oxide layers. The ability to avoid extra oxide fabrication means that the wafer remains flat which enhances the ability to perform subsequent fabrication steps with a planar surface.

BRIEF DESCRIPTION OF DRAWINGS

FIGS. 1–8 are exemplary cross-sectional diagrams of a registration mark formation in a semiconductor technology.

MODES FOR CARRYING OUT THE INVENTION

Figure 1:
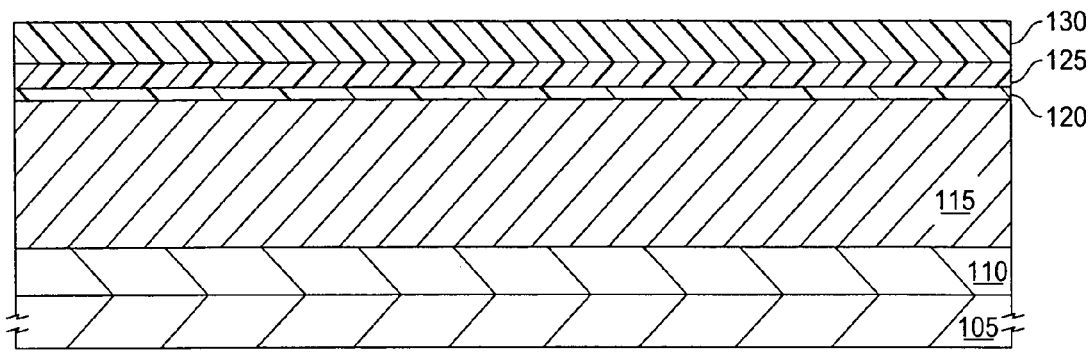

With reference to FIG. 1, an exemplary starting cross-section of a double well technology 100 begins with an oxide isolation layer 110 positioned on top of a semiconductor substrate 105. A continuous layer of silicon on insulator layer 115 is produced over the oxide isolation layer 110.

In a specific exemplary embodiment, the oxide isolation layer 110 ranges from 3,000 to 20,000 angstroms (Å) of silicon dioxide ($SiO_2$). The oxide isolation layer 110 is, for example, thermally grown on top of the semiconductor substrate 105 if the substrate 105 is silicon. The silicon on insulator layer 115 is fabricated on top of the oxide isolation layer 110 to a thickness ranging from 0.2 to 20 micrometers (μm). The first oxide layer 120 is a 100 Å pad oxide thermally grown on the silicon on insulator layer 110. 200 Å of silicon nitride (SiN) is applied upon the first oxide layer 120 to form a silicon nitride layer 125. Upon the silicon nitride layer 125, a 500 Å layer of oxide is produced by high-density plasma chemical vapor deposition (HDP-CVD) to form the second oxide layer 130.

Figure 2:
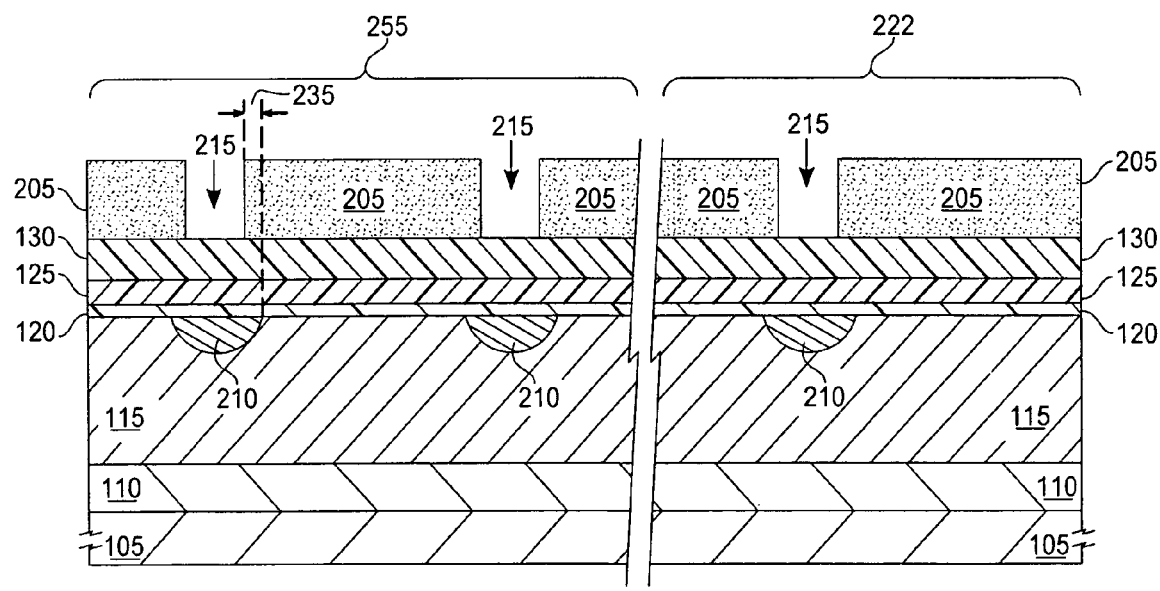

With reference to FIG. 2, a first photoresist 205 is applied, for example, 6000 Å, on top of the second oxide 130. The application is performed, for example, both in a frame area 222 and an active area 255. The first photoresist 205 is treated as a critical layer and patterned to form a plurality of first dopant windows 215 for nwell regions. First dopant regions 210 are formed beneath the first thermal oxide 120. Formation of the first dopant regions 210 is accomplished by, for example, a range of 10 to 1,000 keV of phosphorus doping by ion beam implantation at a dose of $1\times10^{12}$ to $5\times10^{14}$ cm$^{-2}$ through the first dopant windows 215 into an upper surface of the silicon on insulator layer 115. The first dopant regions 210 overlap a defining edge of the first photoresist 205 by a first lateral diffusion overlap 235. After the implant, an annealing step eliminates any lattice damage in the silicon on insulator layer 115.

Figure 3:
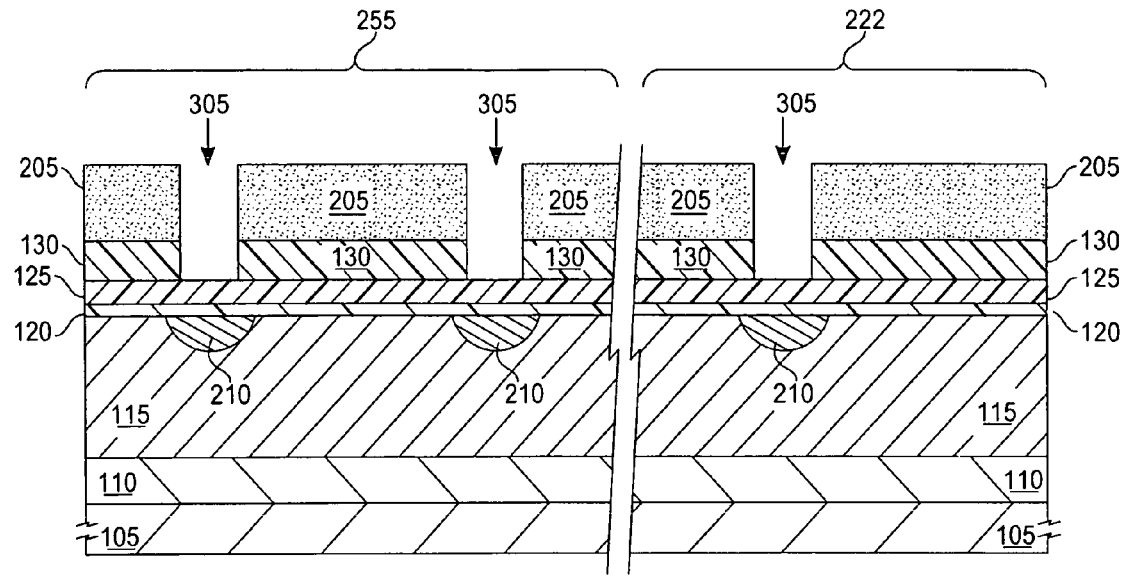

With reference to FIG. 3, etched second oxide windows 305 are positioned in the second oxide layer 130. The second oxide windows 305 are etched in the second oxide 130 at locations of the first dopant windows 215 (FIG. 2). Remnants of the second oxide windows 305 are first alignment artifacts for forming a registration mark (not shown) described infra.

Figure 4:
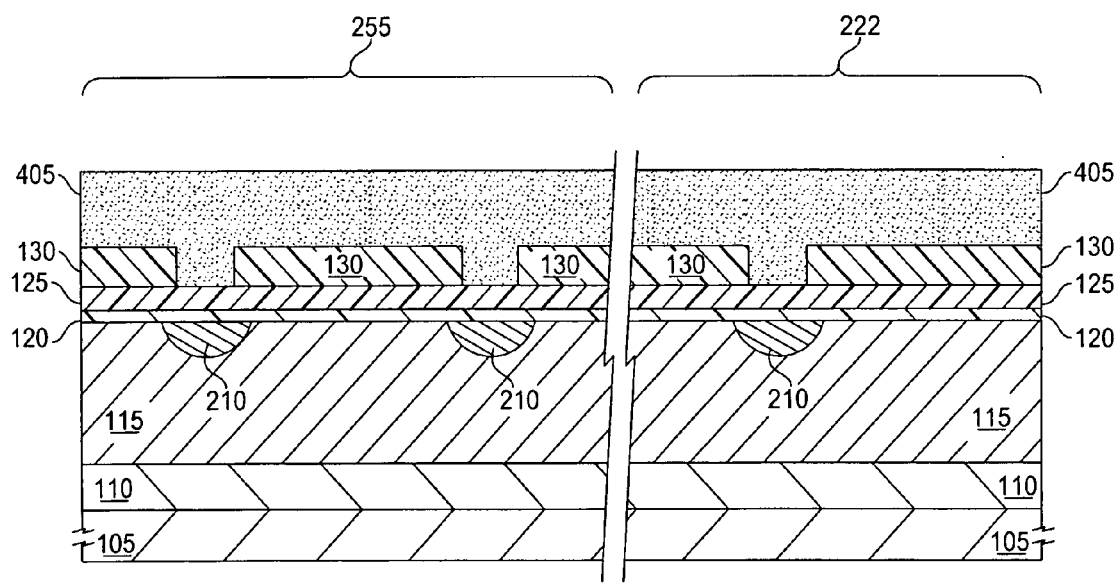

With reference to FIG. 4, a second photoresist 405 is applied to the surface of a double well technology device. The second photoresist 405 is applied to a thickness of, for example, 6000 Å above the second oxide layer 130 and fills the locations of the second oxide windows 305. The second oxide windows 305 formed at the sites of the first dopant windows 215 forms a self-aligned layer over the first dopant regions 210 for protection from subsequent implantation.

With reference to FIG. 5, a patterned second photoresist 505 resides on top of the second oxide 130 and the silicon nitride 125 after patterning of the second photoresist 405. A correctly patterned second photoresist 505 assists in forming a subsequent doped region. The patterned second photoresist 505 forms oxide dopant windows 510a over the second oxide 130 and nitride dopant windows 510b over the silicon nitride layer 125. A second dopant region 515 of an acceptor dopant, for example, is implanted into an upper surface of the device through both types of dopant windows 510a, 510b. A dose of an acceptor dopant, for example, such as boron difluoride ($BF_2$) at about a range of $1 \times 10^{12}$ to $5 \times 10^{14}$ $cm^{-2}$ forms the second dopant region 515.

The oxide dopant windows 510a are positioned in the active area 255 and the frame area 222 relative to the first alignment artifacts. The first alignment artifacts are the second oxide windows 305 (FIG. 3). In the active area 255, a second oxide window to oxide dopant window spacing 555 is maintained between edges of second oxide windows 305 and edges of oxide dopant windows 510a. The second dopant region 515 overlaps a defining edge of the second photoresist 505 by a second lateral diffusion overlap 535. The first dopant region 210 is positioned relative to the second dopant region 515 by maintaining a first dopant to second dopant spacing 545 as a minimum to ensure that no overlap of the two regions occurs in the active area 255. The second oxide window to oxide dopant window spacing 555 is chosen sufficiently large to maintain the first dopant to second dopant spacing 545.

Where the second dopant region 515 overlaps the first dopant region 210 in the frame area 222 (FIG. 2), an overlap region 520 is formed. In the frame area 222, a nitride dopant window to second oxide window overlap 525 is maintained between edges of nitride dopant windows 510b and edges of oxide dopant windows 510a. The nitride dopant windows 510b are the same first alignment artifacts, or remnants of the second oxide windows 305 (FIG. 3), mentioned supra.

With reference to FIG. 6, a registration mark recess 605 is formed by etching through the nitride dopant window 510b (FIG. 5), the first thermal oxide 120, and through the vertical extent of the overlap region 520. The upper layer on the overlap region 520 is etched, for example, to a depth of at least 250 Å, to form a lowermost extent of the registration mark recess 605. Geometries of the etching through the nitride dopant window 510b and the first thermal oxide 120 combined with the selectivity of a silicon etchant, ensure that the etching of the upper surface layer of the overlap region 520 is limited in lateral extent. Therefore, no etching of the registration mark recess 605 extends laterally past the overlap region 520.

Figure 7:
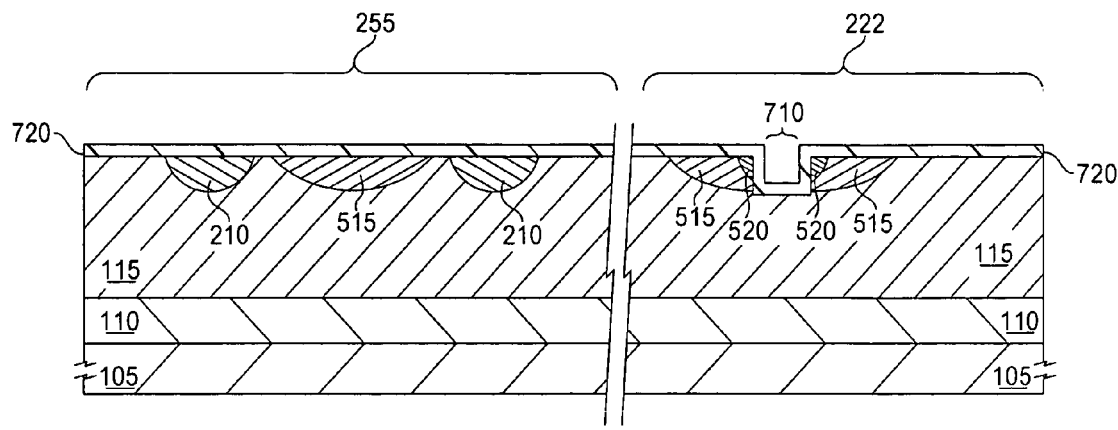

With reference to FIG. 7, a registration mark 710 is formed by removing protective layers and photoresist and by applying a third oxide layer 720. In a specific exemplary embodiment, the registration mark 710 is formed by stripping the 6000 Å critical photoresist, the ONO structure, and applying a 200 Å third oxide layer 720.

The ONO structure is removed by the application of a buffered oxide etch (BOE) and hot phosphoric acid in the sequence BOE/Hot Phosphoric/BOE. For example, silicon oxide removal is performed using a BOE solution of six parts 40% $NH_4F$ and one part 49% HF for an etch rate of about 1200 Å/min at 22° C. A hot phosphoric acid bath of $H_3PO_4$ in an etchant of $H_3PO_4:CrO_3:NaCN$, for example, will remove the silicon nitride layer but not etch the remaining silicon dioxide layer. The third oxide layer 720 is grown thermally on top of the silicon on insulator 115 and covers the registration mark recess 605 (FIG. 6).

Figure 8:
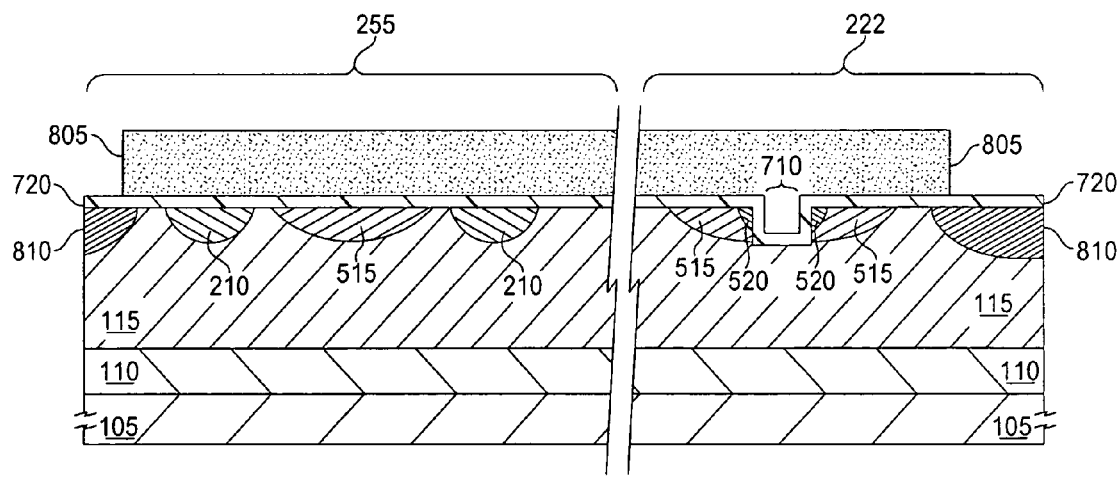

With reference to FIG. 8, a third photoresist 805 is applied to an upper surface of the third oxide layer 720 and patterned for a third dopant. The third photoresist 805 is, for example, a 13,300 Å thick resist layer. The patterning occurs relative to the registration mark 710 within the overlap region 520. A set of third dopant regions 810 is formed. The third dopant region 810 may be formed for example, with a 150 keV ion implant of phosphorus and a dose of $5.4 \times 10^{12}$ $cm^{-2}$.

Figure 9:
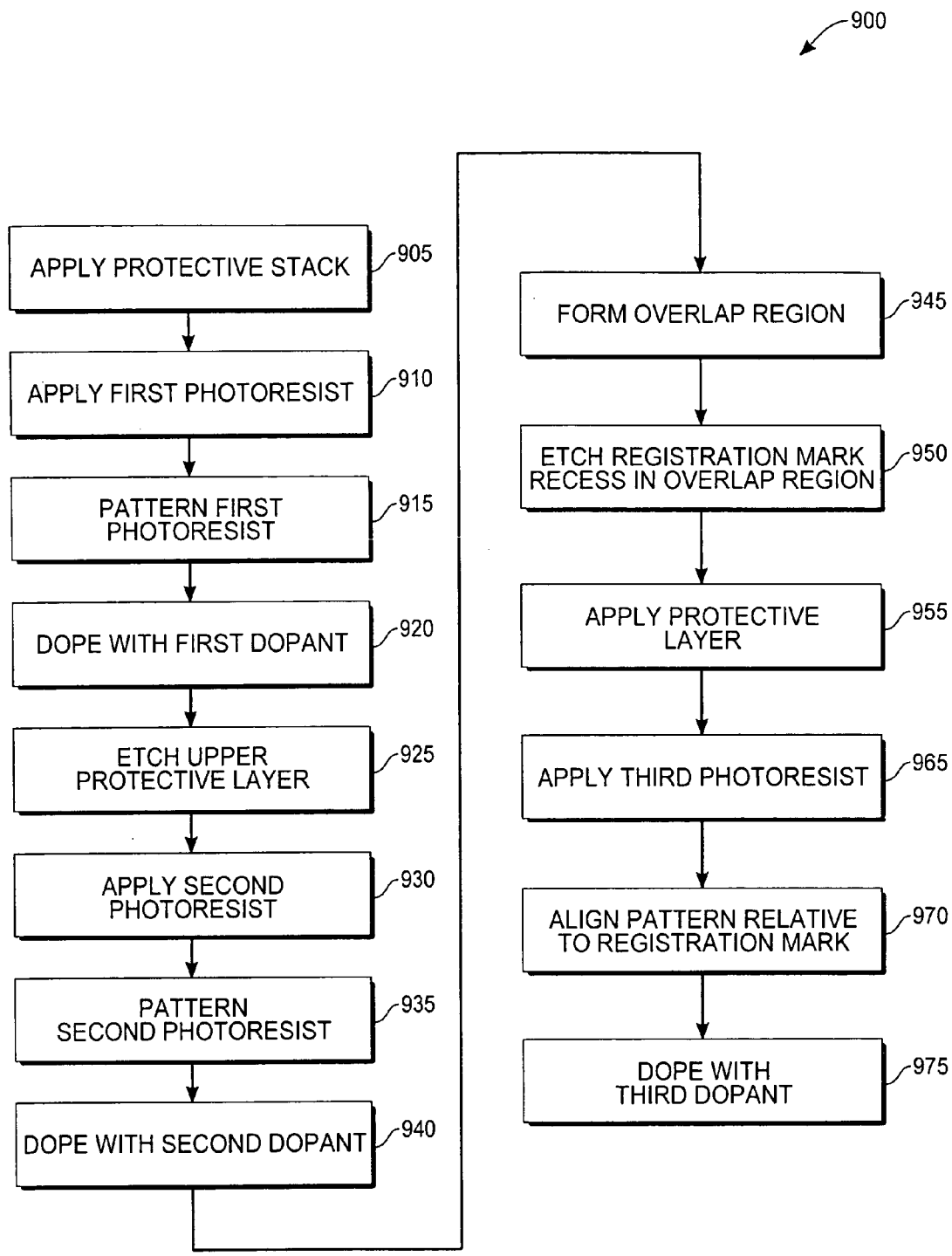
FIG. 9 is an exemplary process flow diagram of a registration mark fabrication of the present invention in a semiconductor technology.

In FIG. 9, an exemplary process flow diagram 900 of a registration mark formation process begins by applying 905 a protective stack to an upper surface of a semiconductor substrate and producing a first dopant region in a device. The first dopant is produced by applying 910 a first photoresist, patterning 915 the first photoresist, and doping 920 the device with a first dopant. The process continues with fabrication of a second dopant by etching 925 an upper portion of the protective layer, applying 930 a second photoresist, patterning 935 the second photoresist, and doping 940 the device with a second dopant. Preparation of the area for the registration mark continues with forming 945 an overlap region, etching 950 a registration mark recess in the overlap region, and applying 955 a protective layer to an uppermost surface of the device, including covering the registration mark recess with the protective layer.

Additional exemplary process flow steps for forming a registration mark continue by utilizing the registration mark for applying 965 a third photoresist to the uppermost surface of the device, aligning 970 a pattern of the third photoresist relative to the registration mark, and doping 975 with a third dopant.

An improved registration mark has been presented which requires no additional masks nor uses any further oxide buildup in its formation. Avoidance of further oxide buildup maintains a planar wafer surface easing registration of further fabrication steps. The improved alignment capabilities provide commensurate enhancement of critical device electrical operating parameters that depend on topological registration.

While various process steps have been portrayed within the present invention in a particular manner, a skilled artisan would recognize that fabrication steps, application of dopants, and stripping processes for various layers is readily accomplished with a variety of different techniques. For instance, a dopant has been described as being applied within an uppermost surface layer of a semiconductor device. A skilled artisan would recognize that such a dopant may be applied as an ion beam implant, diffused from a dopant gas applied within a chamber at an elevated temperature, or applied as a spin-on dopant and diffused at an elevated temperature. An etching process has been described as being performed to provide critical features in a silicon substrate through existing layers of silicon nitride, silicon dioxide, and lightly doped silicon. A skilled artisan would recognize that etching may be performed by wet chemical processes, ion milling, and reactive ion etching. An artisan, skilled in the craft, would also recognize that certain etching processes, such as the wet chemical processes, are either isotropic or anisotropic in a directional selectivity nature. While an application of a first and second dopant has been presented as preceding an etching of an upper portion of the protective layer or an etching of a registration mark recess in an overlap region respectively, an artisan skilled in the field would readily understand that the order of these two steps are reversible.

A registration mark has been described as being fabricated within a double-well technology, being located in a frame area. A skilled artisan would recognize that the registration mark could also be located in a scribe line, a kerf area, or the "streets" between dice. One skilled in the art of semiconductor fabrication would recognize that a registration mark of the present invention may be fabricated within any semiconductor process capable of forming an overlap region of two dopants. A skilled artisan would also recognize that a registration mark of the present invention is also able to be located within any region, including an active area, where, for example, the mark may be utilized for critical alignment of active layer dopants.

Furthermore, the skilled artisan would readily understand how the same registration mark may be fabricated and utilized for registration of maskable features in a wide variety of semiconductor regions to register features for well dopants, active devices, and passive devices. Additionally, a skilled artisan would be able to conceive of the use of a registration mark of the present invention to, in effect, align a maskless fabrication step that in turn relied on a directly registered process step utilizing the present invention. Likewise, the skilled artisan would recognize the applicability of the present invention to a substrate that is not a semiconductor structure, the present invention would be applicable to any substrate amenable to implantation, deposition, coatings, etching, or equivalent fabrication processes to those exemplified.

What is claimed is:

1. An integrated circuit alignment device, the device comprising:
    a first dopant region formed within a first portion of an uppermost surface layer of a substrate;
    a second dopant region formed within a second portion of the uppermost surface layer of the substrate;
    an overlap region formed by an overlap of the first dopant region with the second dopant region; and
    a registration mark situated in the uppermost surface layer within the overlap region, the registration mark configured to provide a reference for aligning features of any subsequent fabrication steps.

2. The device of claim 1, wherein the registration mark provides a reference for aligning one or more regions of further dopants.

3. The device of claim 1, wherein patterning of the first dopant region and etching of an uppermost protective layer within the first dopant region, provides a first alignment artifact for forming the registration mark.

4. The device of claim 1, wherein the registration mark provides an alignment reference for positioning an active layer.

5. An alignment device, the device comprising:
    a first dopant region formed within a first portion of an uppermost surface layer of a semiconductor substrate;
    a second dopant region formed within a second portion of the uppermost surface layer of the semiconductor substrate;
    an overlap region formed by an overlap of the first dopant region with the second dopant region; and
    a registration mark situated in the uppermost surface layer within the overlap region, the registration mark configured to provide a reference for registering or aligning features of any subsequent fabrication steps.

* * * * *